(12) United States Patent
Shinozaki et al.

(10) Patent No.: US 6,269,548 B1
(45) Date of Patent: Aug. 7, 2001

(54) SPIN PROCESSING APPARATUS

(75) Inventors: Hiroyuki Shinozaki, Fujisawa; Junichiro Yoshioka, Yokohama; Kazuaki Maeda, Yokohama; Akihisa Hongo, Yokohama, all of (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/172,147

(22) Filed: Oct. 14, 1998

(51) Int. Cl.⁷ ............................................. F26B 17/24
(52) U.S. Cl. ................................. 34/58; 92/202
(58) Field of Search ................. 34/58, 312, 317, 34/92, 202

(56) References Cited

U.S. PATENT DOCUMENTS

| 4,742,624 | * | 5/1988 | Grant ......................................... 34/58 |
| 4,976,177 | | 12/1990 | Fouche . |
| 5,232,328 | * | 8/1993 | Owczarz et al. ...................... 414/222 |
| 5,339,539 | * | 8/1994 | Shiraishi ................................. 34/58 |
| 5,435,075 | * | 7/1995 | Shiraishi et al. ......................... 34/58 |
| 5,630,881 | | 5/1997 | Ogure et al. . |
| 5,672,212 | * | 9/1997 | Manos ................................... 134/1.3 |
| 5,818,137 | | 10/1998 | Nicholas et al. . |
| 5,855,681 | * | 1/1999 | Maydan et al. ....................... 118/719 |
| 5,976,312 | * | 11/1999 | Shimizu et al. ...................... 156/345 |

FOREIGN PATENT DOCUMENTS

| 0435338 A2 | * | 7/1991 | (EP) . |
| 0 435 338 | | 7/1991 | (EP) . |
| 7-58036 | | 3/1995 | (JP) . |

* cited by examiner

*Primary Examiner*—Pamela Wilson
(74) *Attorney, Agent, or Firm*—Wenderoth, Lind & Ponack, L.L.P.

(57) ABSTRACT

A spin processing apparatus can prevent contamination of workpieces by wear particles, and can operate at high efficiency while lowering the noise level associated with the operation of the apparatus. The spin processing apparatus includes a chamber, a spin holder disposed inside the chamber for holding workpieces, and driver device for rotating the spin holder. A supporting device is provided for rotatably supporting the spin holder in a non-contact manner through a magnetically-operated mechanism.

19 Claims, 6 Drawing Sheets

FIG. 3A

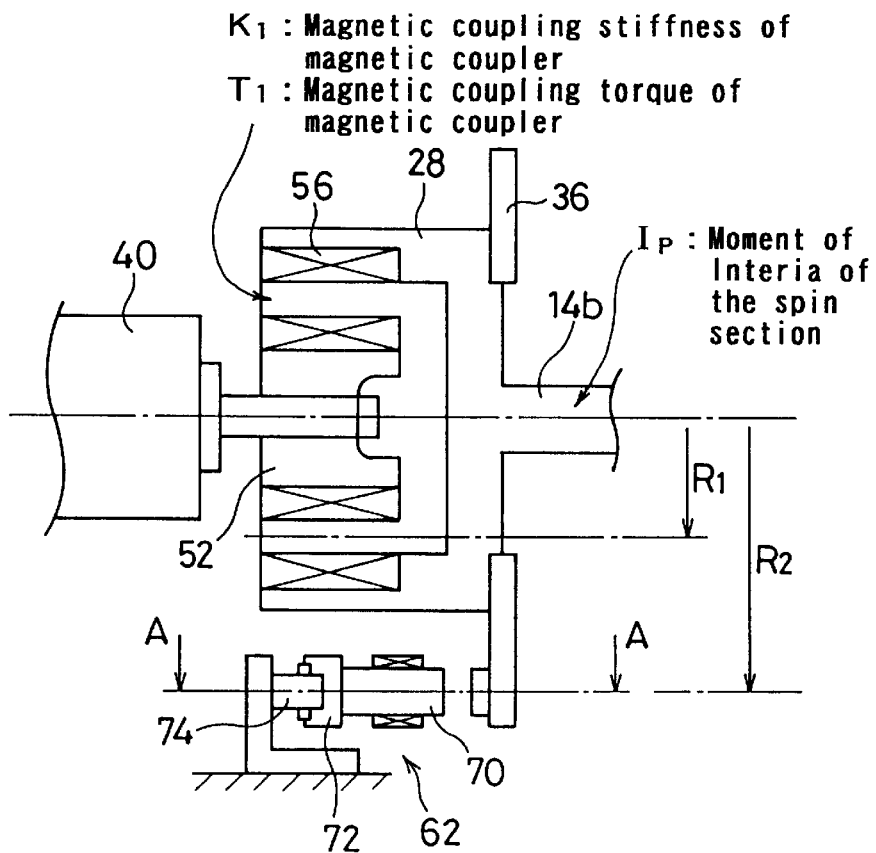

$K_1$ : Magnetic coupling stiffness of magnetic coupler
$T_1$ : Magnetic coupling torque of magnetic coupler
$I_P$ : Moment of Interia of the spin section

FIG. 3B

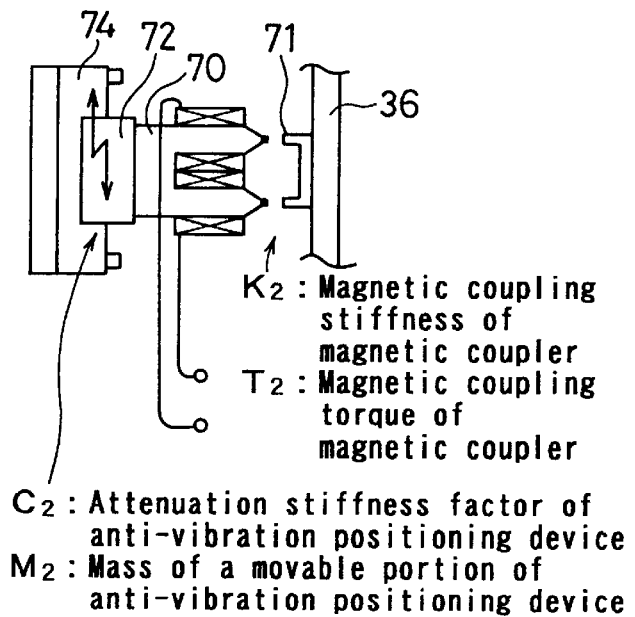

$K_2$ : Magnetic coupling stiffness of magnetic coupler
$T_2$ : Magnetic coupling torque of magnetic coupler
$C_2$ : Attenuation stiffness factor of anti-vibration positioning device
$M_2$ : Mass of a movable portion of anti-vibration positioning device

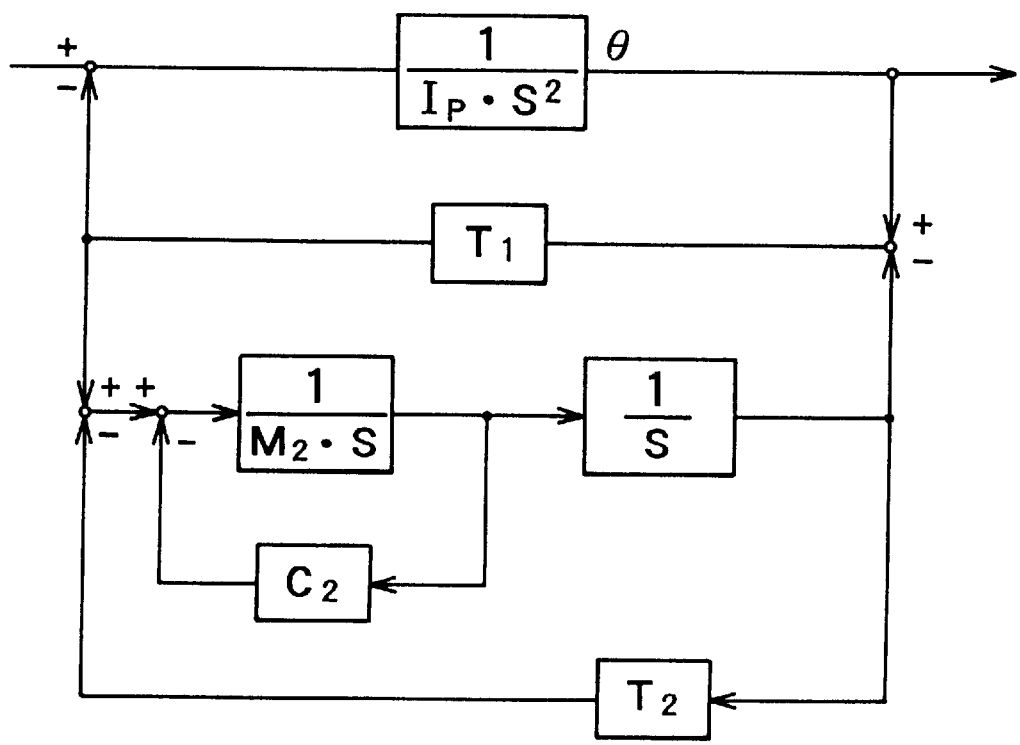
F I G. 4

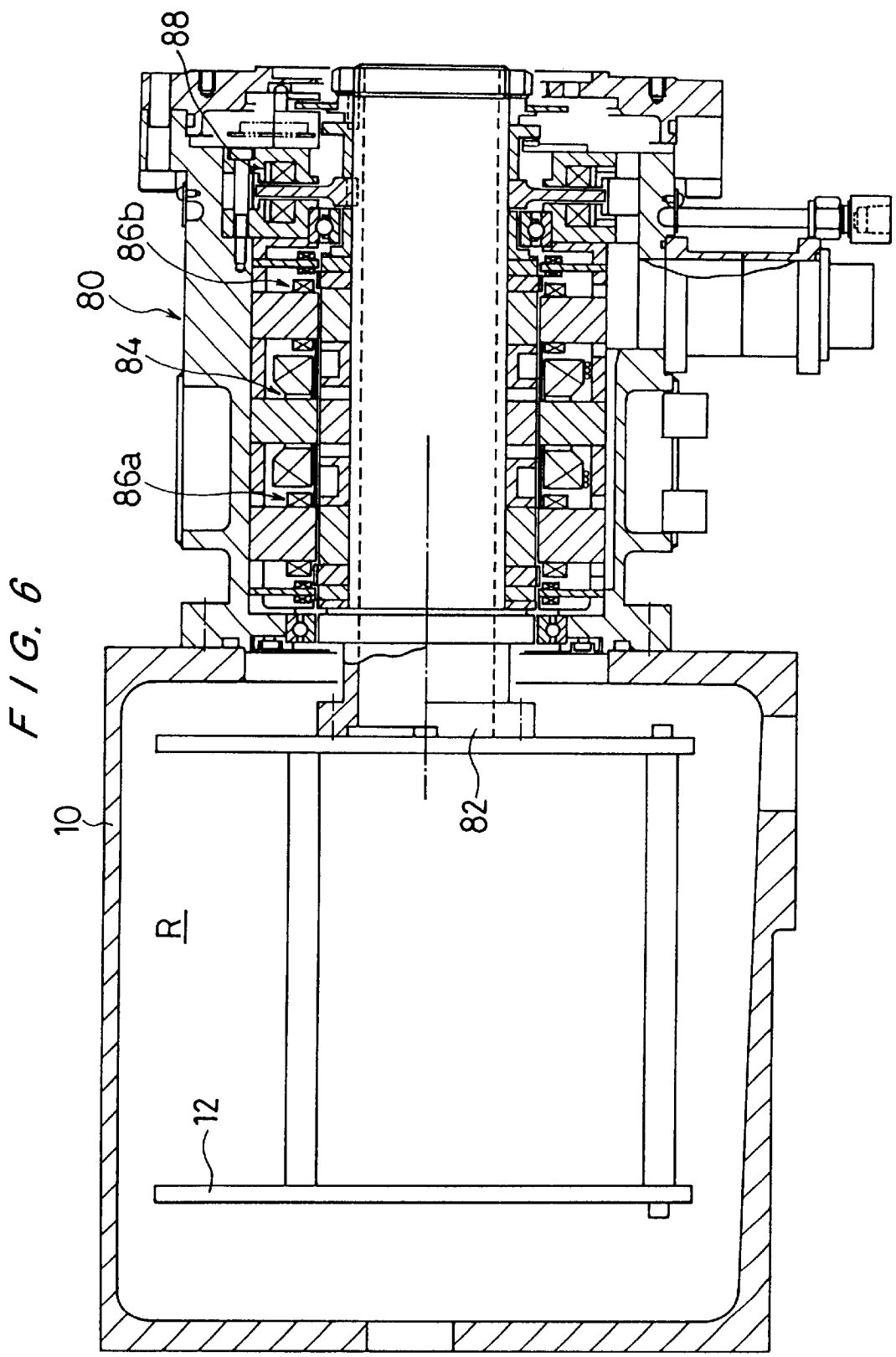

SPIN PROCESSING APPARATUS

BACKGROUND OF THE INVENTION

1. Field of the Invention

The present invention relates to an apparatus for providing processing such as dewatering and drying of workpieces such as washed semiconductor wafers, for example, while spinning the workpieces in a chamber defining a clean environment.

2. Description of the Related Art

In manufacturing processes for making semiconductor devices and liquid crystal displays, sometimes there is a need to quickly dry disk-shaped workpieces or wafers which have been subjected to rigorous washing steps. Some of such apparatuses are based on drying the wafer by spinning off the liquid by centrifugal force in a chamber of so-called spin drying apparatus. There are two types of spin drying apparatuses: a vertical type with a vertical spinning axis with the advantage of a small installation space, and a horizontal type with a horizontal spinning axis with the advantage of convenient vertical loading of wafers.

Both type of spin drying apparatuses share a common structural feature that a workpiece is held in a rotating wafer holder, having a rotation shaft extending along the rotational axis of the holder inside a chamber. In a widely used design for supporting the wafer holder, the rotation shaft is rotatably supported through a contact-type bearing and is united to a drive shaft of a drive device by mechanical coupling.

However, such contact-type bearing mechanisms for the rotation shaft are vulnerable to wear and generation of wear debris, presenting a problem of contamination of the wafers which had been subjected to careful cleaning. Another problem is that the service life of the bearing device is shortened by frictional wear, resulting in a lower operation efficiency due to frequent requirements for maintenance. The working environment is also degrade by noise generated by the operation of high-speed spin dryer.

SUMMARY OF THE INVENTION

It is an object of the present invention to provide a spin processing apparatus that can prevent contamination of workpieces by wear particles, and can operate at high efficiency while lowering the noise level associated with the operation of the apparatus.

Such object has been achieved in a spin processing apparatus for processing workpieces while rotating the same comprising: a chamber; a spin holder disposed inside the chamber for holding workpieces therein; a driver device for rotating the spin holder; a supporting device for rotatably supporting the spin holder in a non-contact manner through a magnetically-operated mechanism.

Accordingly, by rotatably supporting the spin holder in a non-contacting manner by using a magnetically-operated mechanism, generation of wear debris can be prevented. Lowering of service life due to wear of the rotation sections and associated noise generation can also be prevented.

The magnetically-operated mechanism may be comprised by radial magnetic bearing means for rotatably supporting a rotation shaft extending along a rotational axis of the spin holder, and axial magnetic bearing means.

The rotation shaft may be operatively joined to the driver device by way of magnetic coupling means in a non-contact manner. By using such a configuration and providing a in-between partition member, the interior space of the chamber can be separated from the drive-side devices so that cleanliness inside the chamber is improved. Also, residual vibrational movement of the spin holder can be prevented by the use of an anti-vibration positioning device.

The chamber may be provided with fluid handling means for introducing or discharging a gaseous or liquid medium. Accordingly, by introducing or discharging a gaseous or liquid medium while spin processing the workpieces, processes of cleaning and drying can be facilitated to increase the operational efficiency of the apparatus.

The apparatus may be provides with pressure control means for controlling a chamber pressure over a range of pressures from atmospheric pressure to a high vacuum. Accordingly, by controlling the interior pressure of the chamber, high vacuum or pressure variation can be utilized to perform various processes.

The magnetically-operated mechanism may be provided with gas flow means for eliminating particles residing in the mechanism by flowing a purge gas through the mechanism. According, further protection is provided to eliminate contamination of workpieces.

As explained above, the present spin processing apparatus utilizes magnetic bearings for rotating members to provide support in a non-contact manner, it is able to prevent generation of particles produced by wear of support members so that contamination arising from the apparatus can be prevented even for those workpieces requiring a high degree of cleanliness. Furthermore, loss of service life due to wear and the necessity for frequent inspections are reduced to provide high production efficiency, and the working environment is improved by reducing sources of noise generation.

BRIEF DESCRIPTION OF THE DRAWINGS

FIGS. 3A, 3B are schematic cross sectional views of an anti-vibration positioning device;

FIG. 4 is a block diagram of the anti-vibration positioning circuit;

FIG. 6 is an overall cross sectional view of a third embodiment of the apparatus.

DETAILED DESCRIPTION OF THE PREFERRED EMBODIMENTS

Figure 1:
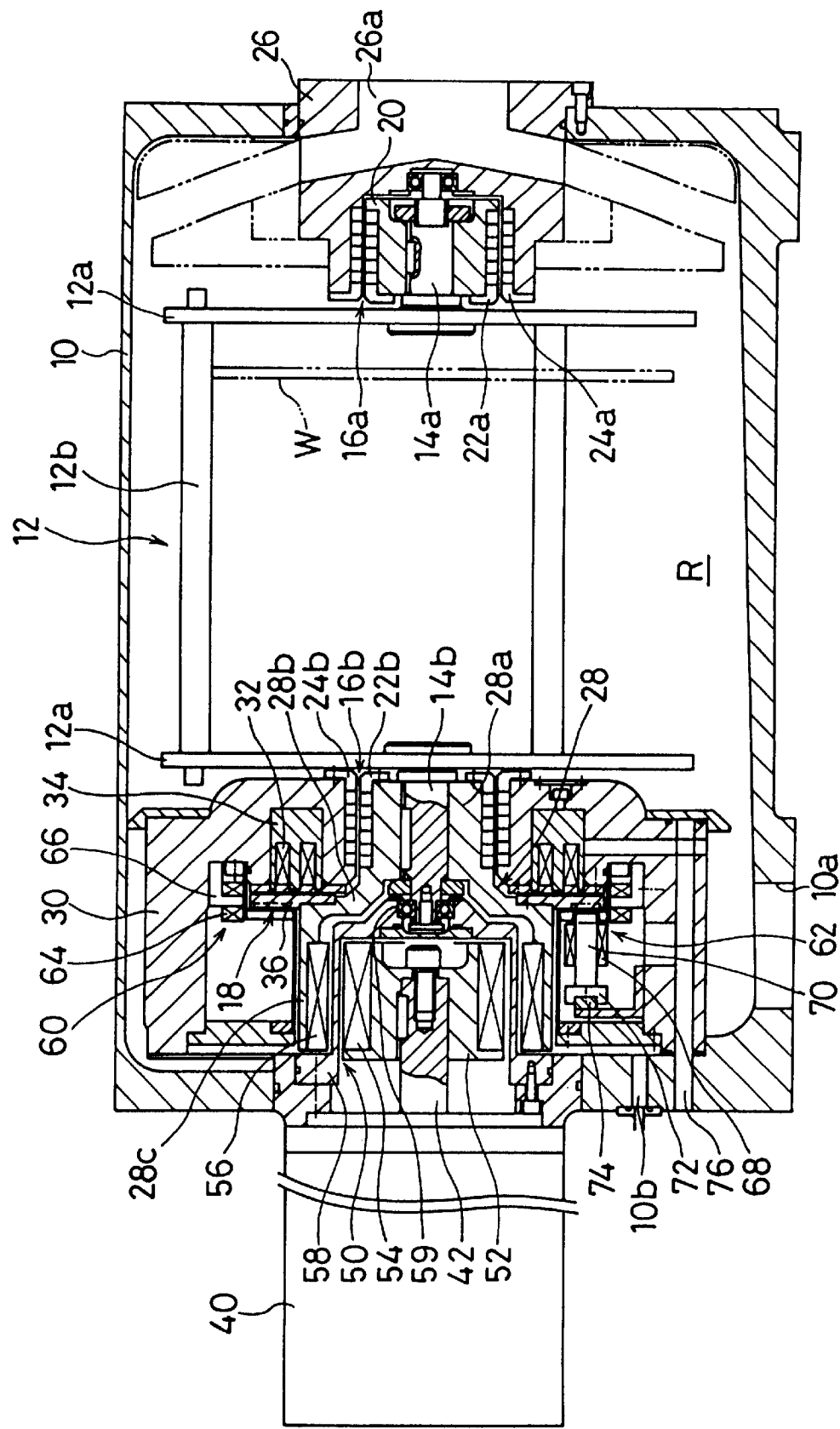
FIG. 1 is an overall cross sectional view of a first embodiment of the apparatus.
Figure 2:
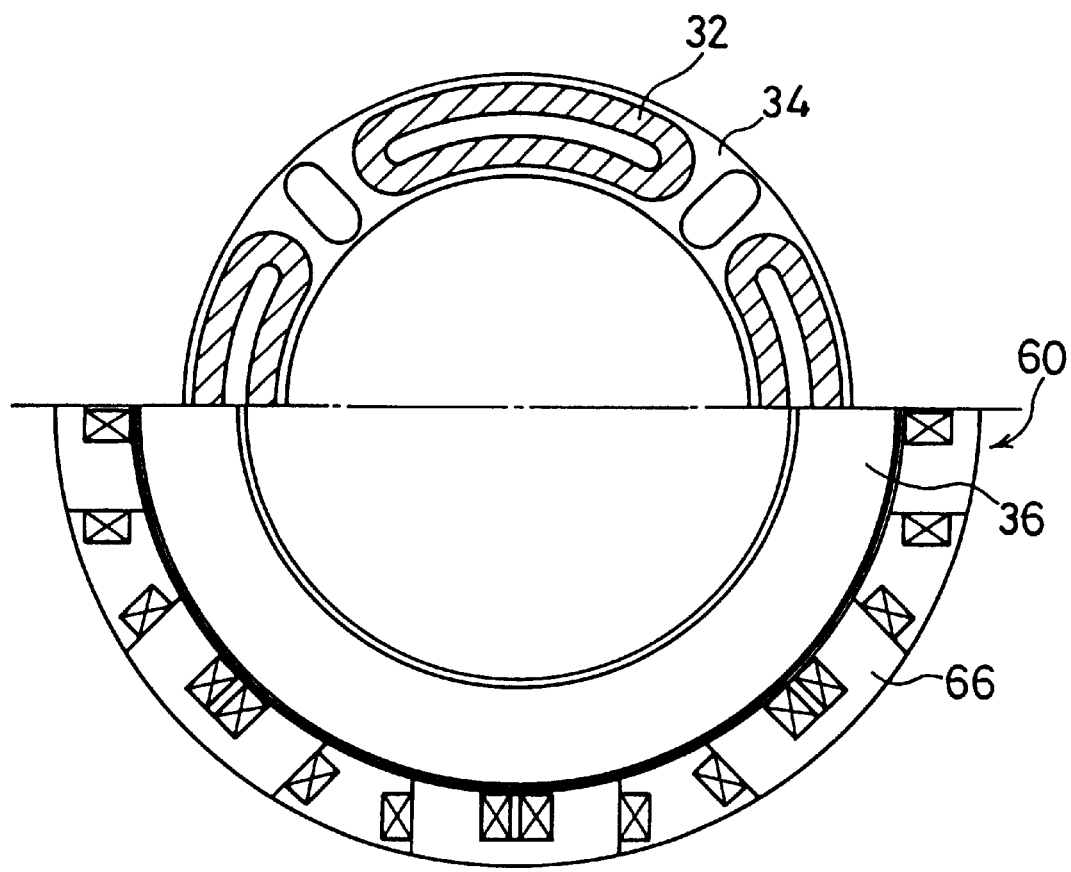
FIG. 2 is a cut-away cross sectional view of an axial bearing unit.

In the following, preferred embodiments will be presented with reference to the drawings. FIGS. 1 and 2 show a first embodiment of the spin drying apparatus of the present invention for spin drying of workpieces W such as semiconductor wafers. The apparatus is comprised by: a chamber 10 having a roughly cylindrical space R; a spin holder 12, for holding workpieces W, having a frame structure and rotatably held inside the chamber 10; and drive motor 40 for rotating the spin holder 12. Spin holder 12 includes two side plates 12a, rods 12b, connecting the two side plates 12a, and two rotation shafts 14a, 14b aligned on rotational axis and extending away from the plates 12a. In the bottom region of the chamber 10, a discharge opening 10a is provided to discharge liquid extracted from the workpieces W and the working atmosphere inside the chamber 10.

Within the chamber 10, a first support block 26 is provided on the open-side of the apparatus, having an intake path 26a of a Y-shaped cross-sectional profile to communicate the interior space R with the exterior environment via an unshown air filter, while a second support block 30 is provided on the drive-side (or sealed side) of the apparatus. The intake path 26a may be communicated to an exterior gas source for providing clean and inactive gas. A radial magnetic bearing 16a is provided between the rotation shaft 14a and the first support block 26, and radial magnetic bearing 16b, an axial magnetic bearing 18 and a magnetic coupler 50 are provided between the rotation shaft 14b and the second support block 30. All the components described above constitute the support mechanism for rotatably supporting the spin holder 12.

In more detail, a sleeve member 20 is attached so as to surround and rotate with the open-side rotation shaft 14a, and a rotor-side magnetic member 22a is attached to the outer periphery of the sleeve member 20, and a stator-side magnetic member 24a is attached to the inner surface of block 26 opposite to the rotor-side magnetic member 22a. In this embodiment, these magnetic material members 22 a, 24a are all made of permanent magnet, and comprise a passive-type radial magnetic bearing unit which does not perform any control functions.

On the sealed-side rotation shaft 14b, a cylindrical rotation member 28 having a small-diameter section 28a, an expansion section 28b and a large-diameter section 28c is attached so as to rotate as a unit with the shaft 14b. Another passive type radial magnetic bearing 16b similar to the open-side radial bearing 16a is provide between the small-diameter section 28a and the second support block 30. In detail, a rotor-side magnetic member 22b is provided on the outer surface at a proximal end of the cylindrical rotation member 28 and a stator-side magnetic member 24b is provided on the inner surface of block 30 opposing a rotational magnetic member 22b. These radial magnetic bearings 16a, 16b are designed so that the opposing magnets become slightly displaced to each other at the operational position of the apparatus so that the spin holder 12 will be biased towards the sealed-side of the apparatus.

As shown if FIGS. 1 and 2, a target disk 36 comprised by a hollow magnetic disk is provided in the expansion section 28b of the cylindrical rotation member 28, and a corresponding electromagnet 34 with a coil 32 to oppose the target disk 36 is attached inside the second support block 30. Axial magnetic bearing 18 is thus actively controllable for controlling the displacement of the spin holder 12 by balancing the force of attraction generated by the electromagnet 34 with the axial force produced by the biased displacement of radial magnetic bearings 16a, 16b.

Magnetic coupler 50 is provided for detachably coupling drive shaft 42 of the drive motor 40 and the rotation shaft 14b on the drive-side. Magnetic coupler 50 is comprised by a driver magnetic member 54 and follower magnetic member 56, in such a way that the driver magnetic member 54 is disposed on the outer surface of a sleeve 52 which is attached to the distal end of the drive shaft 42 to rotate with the drive shaft 42, and that the follower magnetic member 56 is disposed on the inner surface opposite to the driver magnetic member 54 in the large diameter section 28c. Electromagnetic coupling between the two magnetic members 54, 56 allows the follower magnetic member 56 to follow the rotation of the drive motor 40 through the driver magnetic member 54 so as to rotate the cylindrical rotation member 28 and the spin holder 12 as a unit.

On the inside wall of the chamber at the driver-side, a cup-shaped partition member 58 is provided to protrude between the sleeve 52 and the large-diameter section 28c of the cylindrical rotation member 28. The partition member 58 hermetically separates the interior space of the chamber from the drive motor-side space. A touchdown bearing 59 is provided at a tip end of the partition member 58 to prevent excessive wobble of the rotation shaft 14b during an emergency. A tube portion of the partition member 58 is designed so that neither the material of construction nor its size would interfere with the electromagnetic coupling action between the driver magnetic member 54 and the follower magnetic member 56.

The apparatus is provided with a damper device 60 and an anti-vibration positioning device 62 for quickly responding to residual vibrational movement generated by stopping of the spin holder 12. Damper device 60 is comprised by and electromagnet 66 with a coil 64 which surrounds the outer peripheral surface of the target disk 36. The anti-vibration positioning device 62 is comprised by and electromagnet 70 having a coil 68 opposing the sealed-side surface of the target disk 36. A rail 74 extending in the tangential direction is provided on the second support block 30, on which a guide 72 attached to proximal end of the electromagnet 70 is slidably mounted for supporting the anti-vibration positioning device 62. The device 62 is provided with a sensor for detecting operating parameters (displacement, speed) so that electric current outputted by a control circuitry (both not shown) is amplified and supplied to the coil 68 of the device 62.

FIGS. 3A, 3B are partial enlarged views of the anti-vibration positioning device 62, and FIG. 4 is a block diagram of the control circuitry. Terms used in these drawings are as follows: S is a transfer function of the system; Ip is moment of inertia of the spin section; θ is angular rotation of spin holder 12; $K_1$ is magnetic coupling stiffness of magnetic coupler 50; $T_1$ is magnetic coupling torque of magnetic coupler 50; $K_2$ is coupling stiffness of anti-vibration positioning device 62; $T_2$ is coupling torque of the device 62; $C_2$ is attenuation stiffness factor of the device 62; and $M_2$ is mass of a movable portion of the device 62.

The operation of the spin drying apparatus will be described in the following. Workpieces W are held in place in and aligned manner in the spin holder 12, then the drive motor 40 is activated to rotate the spin holder 12 while simultaneously exhausting the chamber atmosphere through the discharge opening 10a using and exhaust device (not shown), so that clean air is introduced through the inlet opening of the intake path 26 to quickly dry the workpieces W. Since the spin holder 12 is firmly but non-contactingly supported by radial magnetic bearings 16a, 16b and the axial magnetic bearing 18, a stable and smooth rotation motion is generated even at high speeds.

When the drying process is completed, and the drive motor 40 is to be stopped, the damper device 60 and the anti-vibration positioning device 62 are activated, so that the damper device 60 works to quickly stop the rotation and position the spin holder 12, and the device 62 works to dissipate the magnetic energy produced by the axial movement of target disk 36 and preventing vibrational movement of the spin holder 12. These measures contribute to high operational efficiency and stable operation of the spin drying apparatus.

Since the chamber 10 is hermetically sealed from the drive motor 40 with the partition member 58, even when the chamber 10 is operating under a vacuum, there is no contamination of the interior space of the chamber 10 with substances such as oil used in the drive motor 40. Further, a purge gas inlet 10b is provided to introduce a purge gas (nitrogen gas) into the cylindrical space R so that a positive pressure is maintained in the chamber-side space of the partition member 58 for further preventing the flow of substances from the motor-side of the apparatus. Control wires are led through a cable path 76 provided in the chamber 10 and the second support block 30.

In this embodiment, radial bearings 16a, 16b are passive-type magnetic bearings without using electromagnets so that the spin holder 12 is supported stably at the axial ends thereof while making the apparatus compact and the control devices simple. The apparatus is made further compact by the use of the axial bearing 18 with the electromagnet 34 to bias the radial bearings 16a, 16b arranged in an offset position.

In the above embodiment, passive-type radial magnetic bearings are used, but it is obvious that active-type radial magnetic bearings can be used. In such a case, although the assembly becomes more complex because of additional controls and sensors needed, a higher degree of control can be achieved.

Also, as indicated in FIG. 3B, pole 71 of the electromagnet 70 for the anti-vibration positioning device 62 is located in a specific circumferential location of the target disk 36 so that the device 62 is activated at a specified position of the spin holder 12. Another possible configuration is to arrange a plurality of protrusions or radially extending channels spaced apart at regular intervals in the circumferential direction of the target disk 36 so that the device 62 may be activated at any position of the spin holder 12. This arrangement eliminates a disadvantage of imbalance introduced by locating the pole 71 at one specific location.

Figure 5:
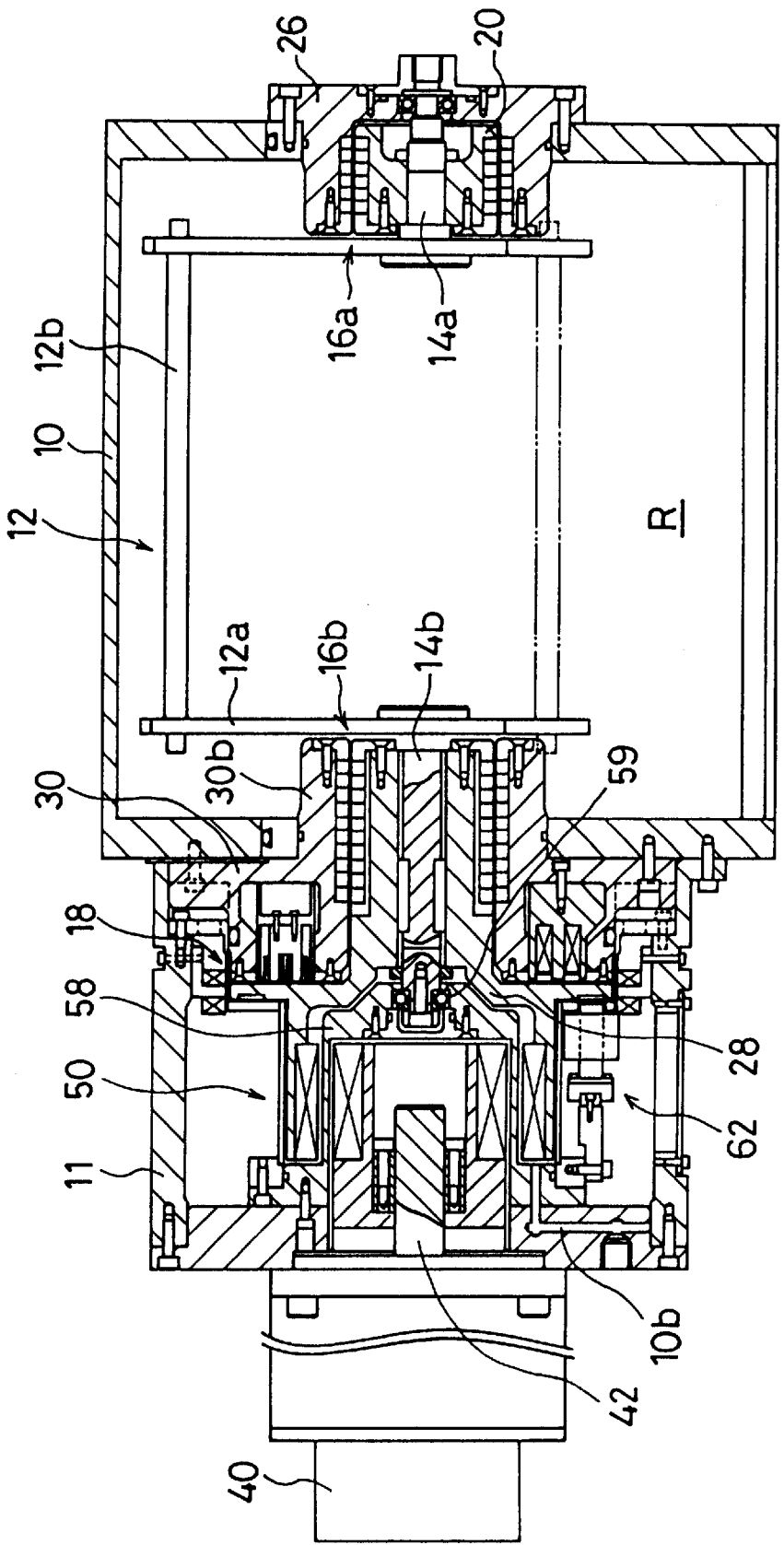
FIG. 5 is an overall cross sectional view of a second embodiment of the apparatus.

FIG. 5 shows a second embodiment in which the drive-side magnetic bearings are housed in bearing casing 11 disposed on the outside of the chamber 10. The second support block 30 constituting the fixed side of the drive side bearing structure encloses the casing 11 adjacent to the chamber 10, and cylindrical section 30b of the second support 30 protrudes through the drive-side wall of the chamber 10.

The structure of the magnetic bearings 16a, 16b, 18, and anti-vibration positioning device 62 are basically the same as those shown in FIG. 1, and their explanations are omitted. In this embodiment, drive-side bearings can be serviced readily by simply removing the bearing casing 11 from the chamber 10. Also, although not shown in the drawing, both air intake and discharge paths are provided in the cylindrical walls of the chamber 10, and therefore, the first support block 26 is not provided with an intake path.

FIG. 6 shows a third embodiment, which is an overhung type where the spin holder 12 is supported only at one end thereof. Support and rotation mechanisms are integrated into a bearing/drive unit 80 having magnetic bearings and a drive motor. The unit 80 is disposed outside the chamber 10, and the spin holder 12 is connected directly to the drive shaft 82 of the unit 80.

The bearing/drive unit 80 is comprised by: a motor section 84 for rotating the drive shaft 82; radial magnetic bearings 86a, 86b disposed on both lateral ends of the motor section 84; and an axial magnetic bearing 88 disposed on the end of the drive shaft 82 opposite to the chamber 10. The drive shaft 82 can be rotated at high speeds under active control of five axes.

In this embodiment, all sliding sections, including touchdown bearing, are eliminated from the interior space of the chamber 10 so that high cleanliness can be maintained at all times. However, because the spin holder 12 is supported at one end only, a long span length of the bearing sections is necessary to prevent shifting of the center of rotation of the spin holder 12, and because of the increased length of support, a higher power motor is necessary.

What is claimed is:

1. A spin processing apparatus for processing workpieces while rotating the workpieces, said apparatus comprising:
   a chamber;
   a spin holder, disposed in said chamber, for holding workpieces, said spin holder including two side plates, and a plurality of rods, connecting said two side plates, for supporting the workpieces;
   at least one rotational shaft extending from one of said plates and defining a rotational axis of said spin holder;
   a driver device for rotating said rotational shaft, and thereby said spin holder, about said rotational axis;
   a supporting device, including a magnetically operated mechanism, for rotatably supporting said rotational shaft in a non-contact manner; and
   anti-vibration positioning means for controlling vibrational movement of said spin holder upon stopping of said spin holder.

2. An apparatus as claimed in claim 1, wherein said magnetically operated mechanism comprises a radial magnetic bearing device providing radial support for said rotational shaft, and an axial magnetic bearing device.

3. An apparatus as claimed in claim 1, further comprising a magnetic coupler joining said rotational shaft to said driver device in non-contact manner.

4. An apparatus as claimed in claim 3, further comprising a partition between said rotation shaft and said driver member and providing a hermetic seal therebetween.

5. An apparatus as claimed in claim 1, further comprising a fluid supply for introducing a fluid medium into said chamber.

6. An apparatus as claimed in claim 1, further comprising a fluid discharge for discharging a fluid medium from said chamber.

7. An apparatus as claimed in claim 1, further comprising a pressure control for controlling a pressure within said chamber over a pressure range from atmospheric pressure to a high vacuum.

8. An apparatus as claimed in claim 1, further comprising a gas supply for supplying a purge gas through said magnetically operated mechanism to eliminate particles in said mechanism.

9. An apparatus as claimed in claim 1, wherein said at least one rotational shaft comprises two rotational shafts extending in opposite directions from respective said two side plates, and said magnetically operated mechanism comprises respective passive magnetic bearings supporting said two rotational shafts in a non-contact manner.

10. An apparatus as claimed in claim 1, wherein said at least one rotational shaft comprises a single rotational shaft extending from said one side plate, and said magnetically operated mechanism comprises plural active magnetic bearings supporting said single rotational shaft in a non-contact manner.

11. A spin processing apparatus for processing workpieces while rotating the workpieces, said apparatus comprising:
   a chamber;
   a spin holder, disposed in said chamber, for holding workpieces, said spin holder including two side plates, and a plurality of rods, connecting said two side plates, for supporting the workpieces;

at least one rotational shaft extending from one of said plates and defining a rotational axis of said spin holder;

a driver device for rotating said rotational shaft, and thereby said spin holder, about said rotational axis;

a supporting device, including a magnetically operated mechanism, for rotatably supporting said rotational shaft in a non-contact manner; and a pressure control for controlling a pressure within said chamber over a pressure range from atmospheric pressure to a high vacuum.

12. An apparatus as claimed in claim 11, wherein said magnetically operated mechanism comprises a radial magnetic bearing device providing radial support for said rotational shaft, and an axial magnetic bearing device.

13. An apparatus as claimed in claim 11, further comprising a magnetic coupler joining said rotational shaft to said driver device in a non-contact manner.

14. An apparatus as claimed in claim 13, further comprising a partition between said rotational shaft and said driver member and providing a hermetic seal therebetween.

15. An apparatus as claimed in claim 11, further comprising a fluid supply for introducing a fluid medium into said chamber.

16. An apparatus as claimed in claim 11, further comprising a fluid discharge for discharging a fluid medium from said chamber.

17. An apparatus as claimed in claim 11, further comprising a gas supply for supplying a purge gas through said magnetically operated mechanism to eliminate particles in said mechanism.

18. An apparatus as claimed in claim 11, wherein said at least one rotational shaft comprises two rotational shafts extending in opposite directions from respective said two side plates, and said magnetically operated mechanism comprises respective passive magnetic bearings supporting said two rotational shafts in a non-contact manner.

19. An apparatus as claimed in claim 11, wherein said at least one rotational shaft comprises a single rotational shaft extending from said one side plate, and said magnetically operated mechanism comprises plural active magnetic bearings supporting said single rotational shaft in non-contact manner.

* * * * *